United States Patent
Lu et al.

(10) Patent No.: US 9,768,308 B2
(45) Date of Patent: Sep. 19, 2017

(54) LOW TEMPERATURE POLY-SILICON THIN FILM TRANSISTOR AND FABRICATION METHOD THEREOF, ARRAY SUBSTRATE AND DISPLAY DEVICE

(71) Applicant: BOE TECHNOLOGY GROUP CO., LTD., Beijing (CN)

(72) Inventors: Xiaoyong Lu, Beijing (CN); Zheng Liu, Beijing (CN); Liang Sun, Beijing (CN); Xiaolong Li, Beijing (CN); Chunping Long, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/768,349

(22) PCT Filed: Mar. 18, 2015

(86) PCT No.: PCT/CN2015/074489
§ 371 (c)(1),
(2) Date: Aug. 17, 2015

(87) PCT Pub. No.: WO2016/058324
PCT Pub. Date: Apr. 21, 2016

(65) Prior Publication Data
US 2016/0254389 A1    Sep. 1, 2016

(30) Foreign Application Priority Data
Oct. 17, 2014  (CN) .......................... 2014 1 0553299

(51) Int. Cl.
*H01L 21/336*    (2006.01)
*H01L 29/786*    (2006.01)
(Continued)

(52) U.S. Cl.
CPC .. *H01L 29/78618* (2013.01); *H01L 21/28518* (2013.01); *H01L 21/28568* (2013.01);
(Continued)

(58) Field of Classification Search
None
See application file for complete search history.

(56) References Cited

U.S. PATENT DOCUMENTS 5,541,119 A * 7/1996 Kodama ............. G02F 1/13454
257/E21.212
6,924,869 B2 * 8/2005 Yu ....................... G02F 1/13454
345/156
(Continued)

FOREIGN PATENT DOCUMENTS

CN    1567550 A    1/2005
CN    1588645 A    3/2005
(Continued)

OTHER PUBLICATIONS

International Search Report of PCT/CN2015/074489 in Chinese, mailed Jun. 25, 2015 with English translation.
(Continued)

*Primary Examiner* — Johannes P Mondt
(74) *Attorney, Agent, or Firm* — Collard & Roe, P.C.

(57) ABSTRACT

A low temperature poly-silicon thin film transistor and a fabrication method thereof, an array substrate and a display device are provided. The method comprises: S1: sequentially forming an active layer (3), a gate insulation layer (4), a gate electrode (5) and an interlayer insulation layer (6) on a base substrate (1); S2: forming a first metal thin film layer (8); S3: performing a hydrogenation treatment on the active layer (3) and the gate insulation layer (6); S4: forming a
(Continued)

second metal thin film layer (7), the second metal thin film layer (7) being used for forming a source electrode and a drain electrode.

14 Claims, 4 Drawing Sheets

(51) Int. Cl.
    *H01L 21/285*     (2006.01)
    *H01L 27/12*     (2006.01)
    *H01L 29/66*     (2006.01)
    *H01L 29/45*     (2006.01)

(52) U.S. Cl.
    CPC ...... *H01L 27/1222* (2013.01); *H01L 27/1274* (2013.01); *H01L 29/458* (2013.01); *H01L 29/665* (2013.01); *H01L 29/66757* (2013.01); *H01L 29/78675* (2013.01); *H01L 29/78696* (2013.01)

(56) References Cited

U.S. PATENT DOCUMENTS

| | | | |
|---|---|---|---|
| 7,785,947 | B2 | 8/2010 | Isobe et al. |
| 2005/0194641 | A1* | 9/2005 | Lai .................... H01L 29/66765 257/347 |
| 2006/0001092 | A1* | 1/2006 | Kim ...................... H01L 27/124 257/347 |
| 2006/0223289 | A1* | 10/2006 | Shimada ............. H01L 21/8221 438/510 |
| 2009/0117692 | A1* | 5/2009 | Koyama ............. H01L 21/2007 438/164 |
| 2009/0203177 | A1* | 8/2009 | Mitsuhashi ....... H01L 29/41783 438/166 |
| 2013/0240977 | A1* | 9/2013 | Kaneoka ........... H01L 29/66833 257/325 |
| 2014/0308812 | A1 | 10/2014 | Arghavani et al. |

FOREIGN PATENT DOCUMENTS

| | | |
|---|---|---|
| CN | 1855399 A | 11/2006 |
| CN | 104409346 A | 3/2015 |

OTHER PUBLICATIONS

Written Opinion of the International Searching Authority of PCT/CN2015/074489 in Chinese, mailed Jun. 25, 2015 with English translation.

Chinese Office Action in Chinese Application No. 201410553299.3, mailed Oct. 8, 2016 with English translation.

Second Chinese Office Action in Chinese Application No. 201410553299.3, mailed Apr. 7, 2017 with English translation.

* cited by examiner

LOW TEMPERATURE POLY-SILICON THIN FILM TRANSISTOR AND FABRICATION METHOD THEREOF, ARRAY SUBSTRATE AND DISPLAY DEVICE

CROSS REFERENCE TO RELATED APPLICATIONS

This application is the National Stage of PCT/CN2015/074489 filed on Mar. 18, 2015, which claims priority under 35 U.S.C. §119 of Chinese Application No. 201410553299.3 filed on Oct. 17, 2014, the disclosure of which is incorporated by reference.

TECHNICAL FIELD

Embodiments of the disclosure relate to a low temperature poly-silicon thin film transistor and a fabrication method thereof, an array substrate and a display device.

BACKGROUND

Low temperature poly-silicon thin film transistor (LTPS TFT) has been widely used in a display field, due to its advantages such as high mobility and stability.

With reference to FIG. 1, a fabrication process of the low temperature poly-silicon thin film transistor comprises: forming a buffer layer 2' and a poly-silicon thin film on a base substrate 1', and patterning the poly-silicon thin film to form an active layer 3' of the thin film transistor; forming a gate insulation layer 4' on the active layer 3'; forming a gate electrode 5' on the gate insulation layer 4'; and then injecting ions into the active layer 3' to form a source region and a drain region; depositing an interlayer insulation layer 6' to cover the gate electrode 5' and the gate insulation layer 4'; forming contact holes directly reaching the source region and the drain region; and then forming a metal layer 7' and patterning the metal layer 7' to form a source electrode and a drain electrode, the source electrode and the drain electrode being connected to the source region and the drain region respectively. In the fabrication process of the above TFT, dangling bonds that have a non-bonding orbital will be generated at an interface between the poly-silicon thin film and the gate insulation layer, and the dangling bonds will lead to performance degradation issues of the thin film transistor, such as a drop in carrier mobility, an increase in threshold voltage, etc.

In general, hydrogen is supplied to the dangling bonds by a hydrogenation process to passivate the dangling bonds at the interface between the poly-silicon thin film and the gate insulation layer. However, since the source and drain electrodes are formed by Titanium-Aluminum-Titanium (TiAlTi) thin film with low resistivity, the hydrogenation process will cause reaction between Ti and Al to form $TiAl_3$ with high resistivity, which eventually results in a relatively high voltage of a common ground terminal, and makes a negative impact on the TFT finally formed.

SUMMARY

According to the embodiments of the disclosure, there is provided a fabrication method of a low temperature poly-silicon thin film transistor. The method comprises: S1: sequentially forming an active layer, a gate insulation layer, a gate electrode and an interlayer insulation layer on a base substrate; S2: forming a first metal thin film layer; S3: performing a hydrogenation treatment on the active layer and the gate insulation layer; S4: forming a second metal thin film layer, the second metal thin film layer being used for forming a source electrode and a drain electrode.

For example, the forming the active layer in step S1 includes: forming an amorphous silicon thin film on the base substrate; performing a crystallization treatment on the amorphous silicon thin film to form a poly-silicon thin film; and patterning the poly-silicon thin film to form the active layer.

For example, after step S1 and before step S2, the method further comprises: forming a via hole on source and drain regions of the active layer, such that the first metal thin film layer and the active layer are in contact with each other at the source and drain regions through the via hole in step S2; after step S2 and before step S3, the method further comprises: performing a first heat treatment such that the first metal thin film layer and the active layer react with each other in a contact region of the first metal thin film layer and the active layer to generate a metal silicide.

For example, after step S3 and before step S4, the method further comprises: removing a portion of the first metal thin film layer provided outside the contact region of the first metal thin film layer and the active layer.

For example, after removing the portion of the first metal thin film layer provided outside the contact region of the first metal thin film layer and the active layer, the method further comprises: performing a second heat treatment on the metal silicide.

For example, a temperature of the second heat treatment is higher than a temperature of the first heat treatment.

For example, the hydrogenation treatment is performed under a temperature of 250-500° C. for 0.5-3 hours.

For example, the first metal thin film layer is made from one or more of tungsten, titanium, cobalt, and nickel.

According to the embodiments of the disclosure, there is provided a low temperature poly-silicon thin film transistor. The low temperature poly-silicon thin film transistor is fabricated by the above-mentioned method.

For example, the source electrode and the drain electrode of the thin film transistor have a dual-layer structure, in which a first layer is formed by the first metal thin film layer and a second layer is formed by the second metal thin film layer.

For example, the first layer is made from titanium, cobalt, nickel or a combination thereof, and the second layer is made from TiAl, TiAlTi or a combination thereof.

For example, the first layer is not made from TiAl, TiAlTi or a combination thereof.

For example, an ohmic contact layer is formed between the source and drain electrodes and the active layer of the thin film transistor, the ohmic contact layer being of a silicide of the first metal thin film layer.

According to the embodiments of the disclosure, there is provided an array substrate. The array substrate comprises the low temperature poly-silicon thin film transistor described above.

According to the embodiments of the disclosure, there is provided a display device. The display device comprises the array substrate described above.

BRIEF DESCRIPTION OF THE DRAWINGS

In order to clearly illustrate the technical solution of the embodiments of the disclosure, the drawings of the embodiments will be briefly described in the following; it is obvious

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
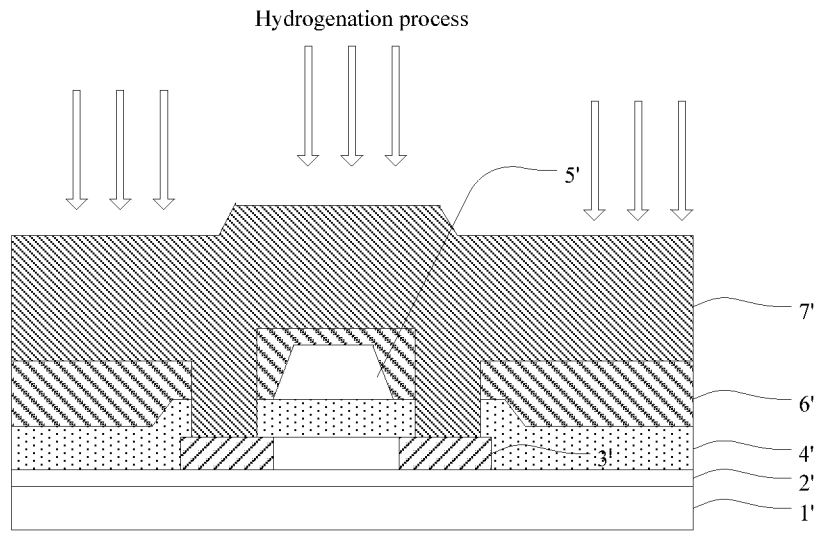
FIG. 1 is a schematic view illustrating performing a hydrogenation treatment on an active layer and a gate insulation layer according to one technique.
Figure 2:
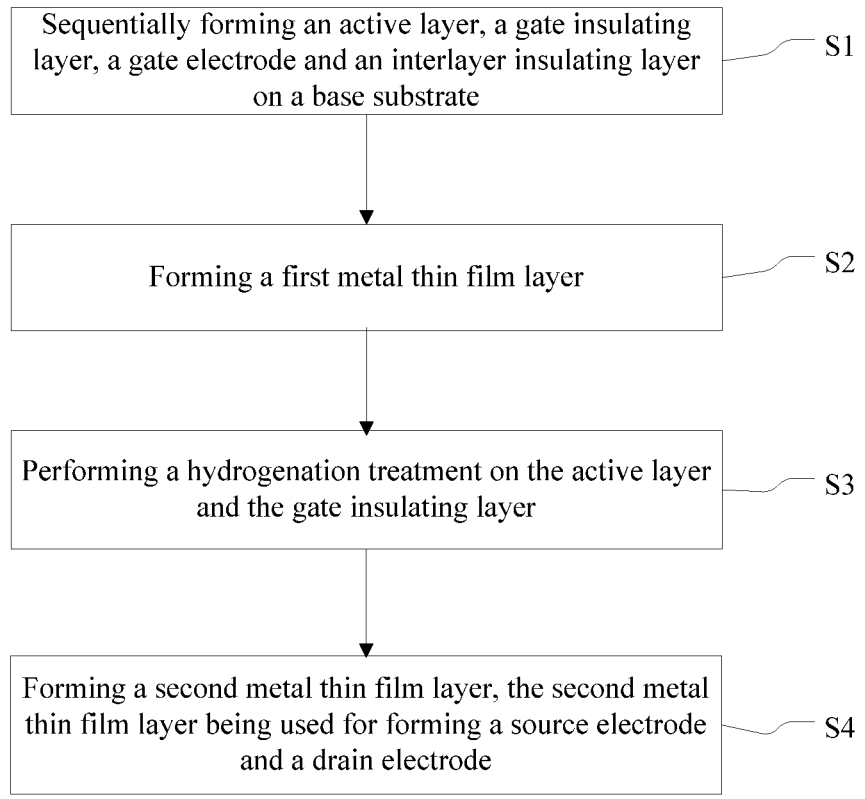
FIG. 2 is a flowchart illustrating a fabrication method of a low temperature poly-silicon thin film transistor according to embodiments of the disclosure.

FIG. 2 is a flowchart of a fabrication method of a low temperature poly-silicon thin film transistor according to the embodiments of the disclosure. As shown in FIG. 2, the method comprises:

S1: sequentially forming an active layer, a gate insulation layer, a gate electrode and an interlayer insulation layer on a base substrate;

S2: forming a first metal thin film layer;

S3: performing a hydrogenation treatment on the active layer and the gate insulation layer;

S4: forming a second metal thin film layer, the second metal thin film layer being used for forming a source electrode and a drain electrode.

For example, the active layer is made from poly-silicon.

For example, the interlayer insulation layer is made from silicon nitride, silicon oxide, silicon oxynitride, or a combination thereof. Further, for example, the interlayer insulation layer at least includes silicon nitride or silicon oxynitride.

For example, the first metal thin film layer is formed on the interlayer insulation layer by a sputtering process. For example, the first metal thin film layer is made from tungsten, titanium, cobalt, nickel or a combination thereof.

The second metal thin film layer may be made from any material suitable for fabricating the source electrode and the drain electrode, for example, TiAl, TiAlTi or a combination thereof.

During the hydrogenation treatment, for example, free hydrogen atoms in the interlayer insulation layer reach an interface between the poly-silicon thin film and the gate insulation layer, to passivate the dangling bonds at the interface between the poly-silicon thin film and the gate insulation layer. In such case, the first metal thin film layer serves as a barrier layer, to prevent the free hydrogen atoms from streaming out of the interlayer insulation layer, such that more hydrogen atoms reach the interface between the poly-silicon thin film and the gate insulation layer to improve a hydrogenation treatment effect.

For example, a temperature of the hydrogenation treatment may be 250-500° C., for example, may be 350° C., 400° C., etc. For example, a time of the hydrogenation treatment may be 0.5-3 hours, for example, may be 1 hour, 2 hours, etc.

For example, for the first metal thin film layer formed in step S2, the first metal thin film layer is removed after performing the hydrogenation treatment on the active layer and the gate insulation layer in step S3. In such case, the first metal thin film layer is made from a material same as that of the second metal thin film layer, for example, TiAl or TiAlTi; or, the first metal thin film layer is made from a material different from that of the second metal thin film layer.

For example, for the first metal thin film layer formed in step S2, the first metal thin film layer is not removed after performing the hydrogenation treatment on the active layer and the gate insulation layer in step S3, and the first metal thin film layer and the second metal thin film layer as a whole are etched after the second metal thin film layer is formed in step S4, to form the source electrode and the drain electrode. In such case, the first metal thin film layer cannot be made from TiAl, TiAlTi or a combination thereof. For example, the source electrode and the drain electrode have a dual-layer structure: a first layer is made from for the material for forming the first metal thin film layer such as tungsten, titanium, cobalt, nickel or a combination thereof, and a second layer is made from a material for forming the second metal thin film layer such as TiAl, TiAlTi or a combination thereof.

In the fabrication method of the low temperature poly-silicon thin film transistor according to the embodiments of the disclosure, the first metal thin film layer is formed on the interlayer insulation layer before the hydrogenation treatment is performed on the active layer and the gate insulation layer, and then the second metal thin film layer for forming the source and drain electrodes is formed after the hydrogenation process, which not only avoids negative impact of the hydrogenation process on the resistance of the source and drain electrodes, but also will not change characteristics of the formed thin film transistor, thus reducing negative impact of the hydrogenation process on the formed thin film transistor. In addition, the first metal thin film layer forms the barrier layer on the interlayer insulation layer, so that hydrogen atoms effectively transport from the interlayer insulation layer that supplies hydrogen to the active layer.

Figure 3:
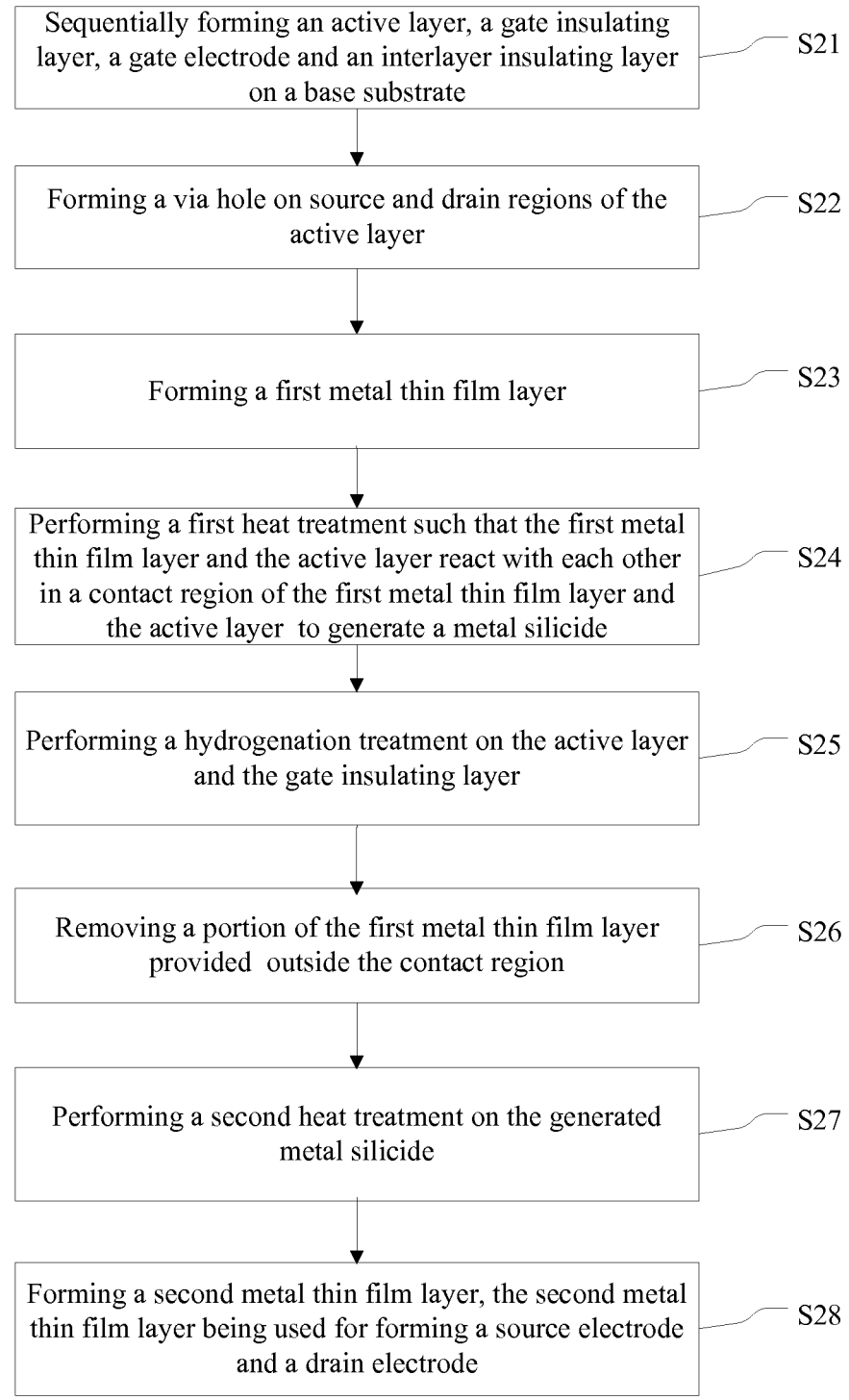
FIG. 3 is a flowchart illustrating another fabrication method of the low temperature poly-silicon thin film transistor according to the embodiments of the disclosure.
Figure 4:
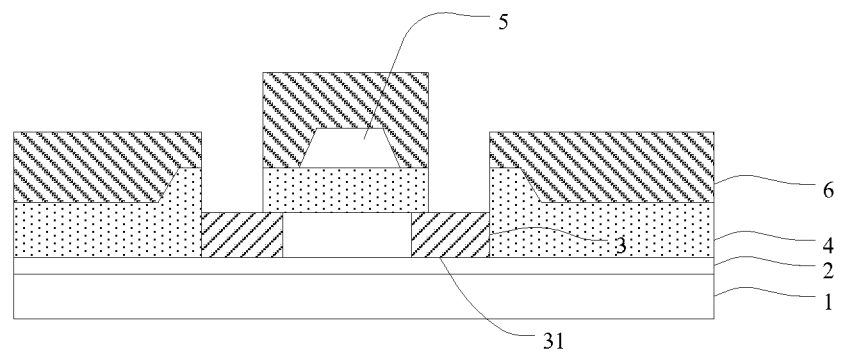
FIGS. 4-9 are schematic views illustrating a process for fabricating the low temperature poly-silicon thin film transistor according to the embodiments of the disclosure.

FIG. 3 is a flowchart of another fabrication method of the low temperature poly-silicon thin film transistor according to the embodiments of the disclosure. The fabrication method comprises steps of:

S21: sequentially forming an active layer, a gate insulation layer, a gate electrode and an interlayer insulation layer on a base substrate;

For example, as shown in FIG. 4, a buffer layer 2 and the active layer 3 are formed on the base substrate 1. For example, the forming the active layer 3 comprises: forming an amorphous silicon thin film on the base substrate; performing a crystallization treatment on the amorphous silicon thin film to form a poly-silicon thin film; patterning the poly-silicon thin film to form the active layer 3.

With further reference to FIG. 4, the gate insulation layer 4 is formed on the active layer 3; the gate electrode 5 is formed on the gate insulation layer 4; and then ions are injected into the active layer 3 to form source and drain regions 31 (including a source region and a drain region); and the interlayer insulation layer 6 covering the gate electrode 5 and the gate insulation layer 4 is formed.

S22: forming a via hole on the source and drain regions 31 of the active layer.

With reference to FIG. 4, the interlayer insulation layer 6 and the gate insulation layer 4 are etched, to form the via hole reaching the source and drain regions 31 of the active layer.

S23: forming a first metal thin film layer 8.

Figure 5:
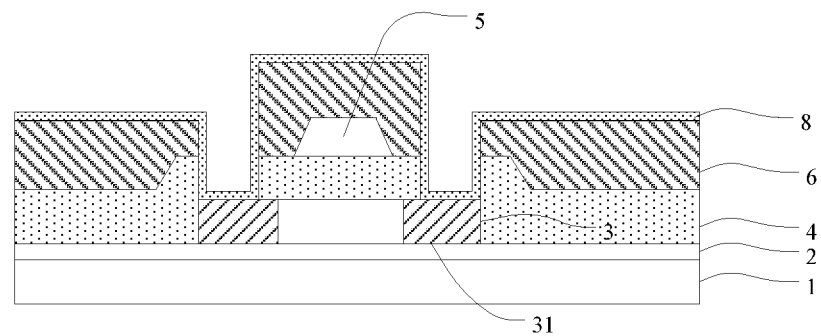

With reference to FIG. 5, the first metal thin film layer 8 is in contact with the source and drain regions 31 of the active layer 3 through the via hole formed in step S22. For example, the first metal thin film layer 8 is formed of one or more metal thin film layers, which may be made from one or more of tungsten, titanium, cobalt, and nickel.

S24: performing a first heat treatment such that the first metal thin film layer 8 and the active layer 3 react with each other in a contact region of the first metal thin film layer 8 and the active layer 3 to generate a metal silicide.

Figure 6:
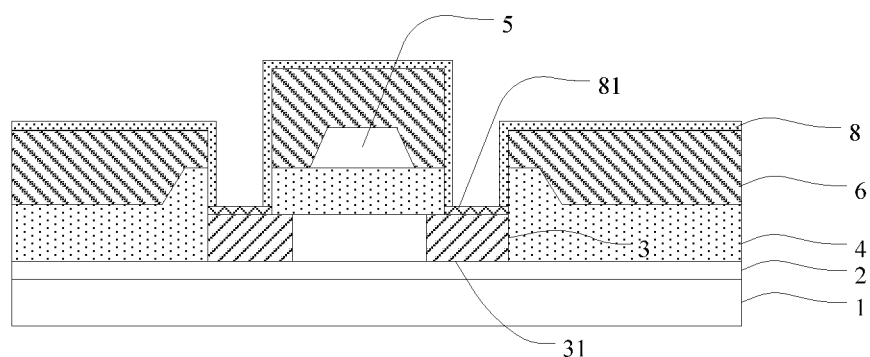
Figure 7:
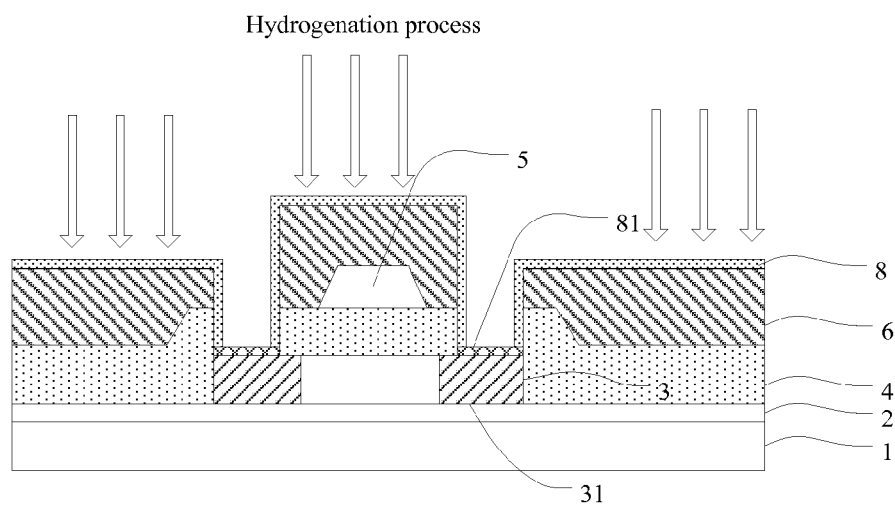

With reference to FIG. 6, for example, the heat treatment is performed on the above structure by a rapid thermal process, such that the first metal thin film layer 8 and the active layer 3 react with each other in their contact region to generate the metal silicide 81. In this way, a self-aligned silicide is formed on the active layer 3.

S25: performing a hydrogenation treatment on the active layer 3 and the gate insulation layer 4.

For example, a temperature of the hydrogenation treatment may be 250-500° C. (for example, may be 350° C., 400° C., etc.). For example, a time of the hydrogenation treatment may be 0.5-3 hours (for example, may be 1 hour, 2 hours, etc.). A barrier layer is formed for the interlayer insulation layer by using the structure obtained through steps S23 and S24, and then the hydrogenation process is performed so that hydrogen atoms are effectively transported from the interlayer insulation layer that supplies hydrogen atoms to the active layer, to passivate the dangling bonds at the interface between the active layer and the gate insulation layer. In addition, step 25 and step 24 can be interchanged, i.e., the hydrogenation treatment is performed firstly, and then the first heat treatment is performed.

S26: removing a portion of the first metal thin film layer provided outside the contact region of the first metal thin film layer 8 and the active layer 3.

Figure 8:
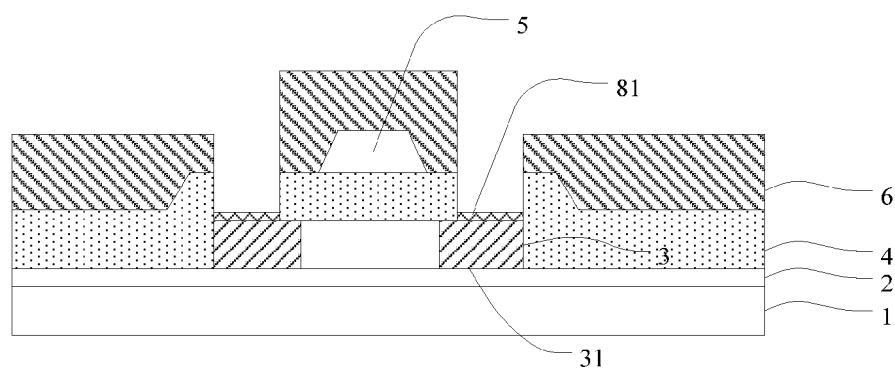

With reference to FIG. 8, a portion of the first metal thin film layer that does not react with the active layer is removed by an etching process (that is, the portion of the first metal thin film layer provided outside the contact region of the first metal thin film layer 8 and the active layer 3 is removed), and the metal silicide generated in the contact region of the first metal thin film layer and the active layer is reserved to serve as an ohmic contact layer between the active layer and the source and drain electrodes to be formed subsequently. Because the generated metal silicide is insoluble in an etchant, the above etching process does not need a mask, and the first metal thin film layer is etched directly by the etchant to remove the portion of the first metal thin film that does not react with the active layer and retain the metal silicide on the source and drain regions 31.

It should be noted that the portion of the first metal thin film layer provided outside the contact region of the first metal thin film layer 8 and the active layer 3 may not be removed. In such case, the first metal thin film layer cannot be made from TiAlTi, TiAl or a combination thereof.

S27: performing a second heat treatment on the metal silicide.

Since the resistivity of the metal silicide generated in step S24 is relatively high, the second heat treatment is performed on the generated metal silicide for example by a rapid thermal process after the hydrogenation process, so as to reduce the resistivity of the generated metal silicide, which is favorable for forming ohmic contact between the source and drain electrodes and the active layer.

For example, a temperature of the second heat treatment is higher than a temperature of the first heat treatment. For example, in a case where the first metal thin film layer 8 is made from Ti, the temperature of the first heat treatment is 550-750° C., and the temperature of the second heat treatment is 700-900° C. For example, in a case where the first metal thin film layer 8 is made from Co, the temperature of the first heat treatment is 400-600° C., and the temperature of the second heat treatment is 650-850° C.

S28: forming a second metal thin film layer 7, the second metal thin film layer 7 being used for forming a source electrode and a drain electrode.

Figure 9:
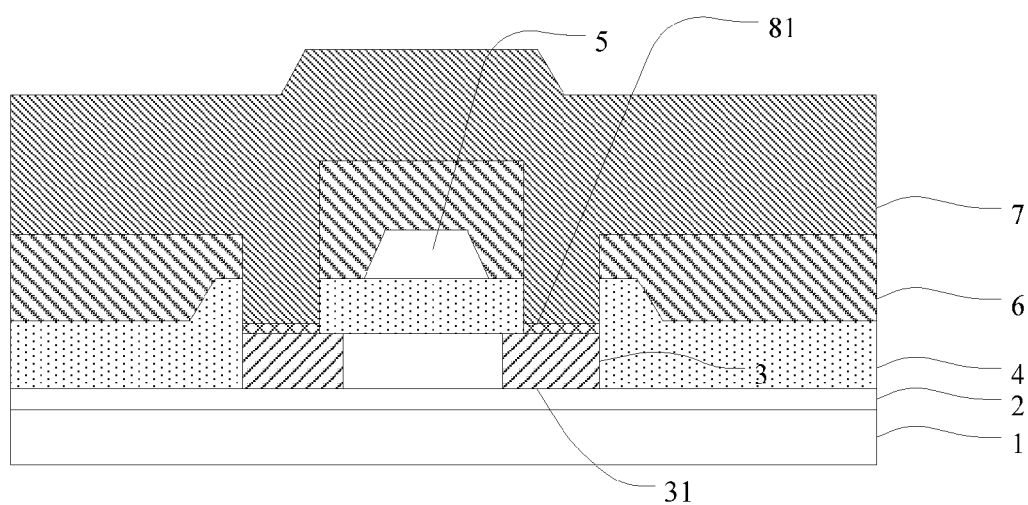

For example, with reference to FIG. 9, the second metal thin film layer 7 may be made from TiAlTi or AlTi with low resistivity, and is formed on the above structure by a sputtering process, and then the second metal thin film layer 7 is etched by an etching process to from the source electrode and the drain electrode.

In the fabrication method of the low temperature poly-silicon thin film transistor according to the embodiments of the disclosure, the first metal thin film layer is formed on the interlayer insulation layer, the first metal thin film layer and the active layer are in contact with each other at the source and drain regions through the via hole, the heat treatment is performed on the first metal thin film layer to generate the self-aligned silicide in the contact region of the first metal thin film layer and the active layer, and then the source and drain electrodes are formed after the hydrogenation process. In this way, not only negative impact of the hydrogenation process on the resistance of the source and drain electrodes is avoided to get better characteristics of the TFT, but also the formed self-aligned silicide facilitates to form good ohmic contact between the source and drain electrodes and the active layer; in addition, the fabrication method does not affect a doping process of the source and drain electrodes, and can improve stability and reliability of the process.

In addition, the embodiments of the disclosure further provide a low temperature poly-silicon thin film transistor fabricated by the above method.

For example, the source electrode and the drain electrode of the thin film transistor have a dual-layer structure: a first layer is made from for the material for forming the first metal thin film layer such as tungsten, titanium, cobalt, nickel or a combination thereof, and a second layer is made from a material for forming the second metal thin film layer such as TiAl, TiAlTi or a combination thereof.

For example, an ohmic contact layer is formed between the source and drain electrodes and the active layer of the thin film transistor, the ohmic contact layer is formed of a silicide of the first metal thin film layer.

In another aspect, the embodiments of the disclosure further provide an array substrate, and the array substrate comprises the low temperature poly-silicon thin film transistor fabricated by the above method.

In still another aspect, the embodiments of the disclosure further provide a display device, and the display device comprises the above array substrate. The display device according to the embodiments of the disclosure may be a liquid crystal display panel, a liquid crystal display, a liquid crystal television, a digital photo frame, a mobile phone, a tablet computer, or any other product or component having a display function.

The foregoing embodiments merely are exemplary embodiments of the present disclosure, and not intended to define the protective scope of the present disclosure, and the protective scope of the present disclosure is determined by the appended claims.

The present application claims priority of Chinese Patent Application No. 201410553299.3 filed on Oct. 17, 2014, the disclosure of which is incorporated herein by reference in its entirety as part of the present application.

What is claimed is:

1. A fabrication method of a poly-silicon thin film transistor, comprising:
   S1: sequentially forming an active layer, a gate insulation layer, a gate electrode and an interlayer insulation layer on a base substrate, and forming a via hole on source and drain regions of the active layer and in the gate insulation layer and the interlayer insulation layer;
   S2: forming a first metal layer, the first metal layer and the active layer being in contact with each other at the source and drain regions through the via hole;
   S3: performing a first heat treatment such that the first metal layer and the active layer react with each other in a contact region of the first metal layer and the active layer to generate a metal silicide, and then performing a hydrogenation treatment on the active layer and the gate insulation layer;
   S4: forming a second metal layer, the second metal layer being configured for forming a source electrode and a drain electrode, wherein
   during performing the hydrogenation treatment on the active layer and the gate insulation layer, the first metal layer is an outermost layer covering the base substrate.

2. The fabrication method of the poly-silicon thin film transistor according to claim 1, wherein
   the forming the active layer in step S1 includes:
   forming an amorphous silicon thin film on the base substrate;
   performing a crystallization treatment on the amorphous silicon thin film to form a poly-silicon thin film; and
   patterning the poly-silicon thin film to form the active layer.

3. The fabrication method of the poly-silicon thin film transistor according to claim 1, wherein after step S3 and before step S4, the method further comprises: removing a portion of the first metal layer provided outside the contact region of the first metal layer and the active layer.

4. The fabrication method of the poly-silicon thin film transistor according to claim 3, wherein
   after removing the portion of the first metal layer provided outside the contact region of the first metal layer and the active layer, the method further comprises: performing a second heat treatment on the metal silicide.

5. The fabrication method of the poly-silicon thin film transistor according to claim 4, wherein a temperature of the second heat treatment is higher than a temperature of the first heat treatment.

6. The fabrication method of the poly-silicon thin film transistor according to claim 1, wherein the hydrogenation treatment is performed under a temperature of 250-500° C. for 0.5-3 hours.

7. The fabrication method of the poly-silicon thin film transistor according to claim 1, wherein the first metal layer is made from one or more of tungsten, titanium, cobalt, and nickel.

8. A poly-silicon thin film transistor fabricated by the method according to claim 1.

9. The poly-silicon thin film transistor according to claim 8, wherein the source electrode and the drain electrode of the thin film transistor have a dual-layer structure, in which a first layer is formed by the first metal layer and a second layer is formed by the second metal layer.

10. The poly-silicon thin film transistor according to claim 9, wherein the first layer is made from tungsten, titanium, cobalt, nickel or a combination thereof, and the second layer is made from TiAl, TiAlTi or a combination thereof.

11. The poly-silicon thin film transistor according to claim 9, wherein the first layer is not made from TiAl, TiAlTi or a combination thereof.

12. The poly-silicon thin film transistor according to claim 8, wherein an ohmic contact layer is formed between the source and drain electrodes and the active layer of the thin film transistor, the ohmic contact layer being of a silicide of the first metal layer.

13. An array substrate, comprising the poly-silicon thin film transistor according to claim 8.

14. A display device, comprising the array substrate according to claim 13.

* * * * *